(12) United States Patent
Shinoda

(10) Patent No.: US 9,340,707 B2
(45) Date of Patent: May 17, 2016

(54) POLISHING COMPOSITION TO BE USED TO POLISH SEMICONDUCTOR SUBSTRATE HAVING SILICON THROUGH ELECTRODE STRUCTURE, AND POLISHING METHOD USING POLISHING COMPOSITION

(71) Applicant: FUJIMI INCORPORATED, Kiyosu-shi, Aichi (JP)

(72) Inventor: Toshio Shinoda, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/394,412

(22) PCT Filed: Apr. 10, 2013

(86) PCT No.: PCT/JP2013/060854
§ 371 (c)(1),
(2) Date: Oct. 14, 2014

(87) PCT Pub. No.: WO2013/157465
PCT Pub. Date: Oct. 24, 2013

(65) Prior Publication Data
US 2015/0111382 A1      Apr. 23, 2015

(30) Foreign Application Priority Data

Apr. 17, 2012   (JP) ................. 2012-093895

(51) Int. Cl.
| C09K 13/06 | (2006.01) |
| C09G 1/02 | (2006.01) |
| B24B 37/04 | (2012.01) |
| C09K 3/14 | (2006.01) |
| H01L 21/306 | (2006.01) |

(52) U.S. Cl.
CPC ............... *C09G 1/02* (2013.01); *B24B 37/042* (2013.01); *C09K 3/1463* (2013.01); *H01L 21/30625* (2013.01)

(58) Field of Classification Search
CPC ...... C09G 1/00; C09G 1/04; H01L 21/30625; H01L 21/31051; H01L 21/3063
USPC ............. 252/79.1, 79.2, 79.3, 79.4; 438/691, 438/692, 693
See application file for complete search history.

(56) References Cited

U.S. PATENT DOCUMENTS

| 2007/0181534 A1* | 8/2007 | Kamimura ............... 216/88 |
| 2009/0014415 A1* | 1/2009 | Chelle et al. ............ 216/53 |
| 2009/0061630 A1* | 3/2009 | Palmer et al. ............ 438/693 |
| 2010/0167546 A1* | 7/2010 | Shi et al. ............... 438/693 |
| 2011/0070736 A1 | 3/2011 | Lee et al. |
| 2011/0250755 A1 | 10/2011 | Morinaga et al. |

FOREIGN PATENT DOCUMENTS

| JP | 2008-066588 A | 3/2008 |
| JP | 2009-144080 A | 7/2009 |
| JP | 2011-066383 A | 3/2011 |
| JP | 2011-222715 A | 11/2011 |
| JP | 2011-258825 A | 12/2011 |

* cited by examiner

*Primary Examiner* — Lan Vinh
(74) *Attorney, Agent, or Firm* — Foley & Lardner LLP

(57) ABSTRACT

Provided is a polishing composition used for polishing a semiconductor substrate having a through-silicon via structure, comprising an oxidizing agent having a standard electrode potential of 350 mV or more and 740 mV or less, a silicon polishing accelerating agent, a through-silicon via material polishing speed increasing agent, a silicon contamination preventing agent, and water.

16 Claims, 1 Drawing Sheet

(a)

(b)

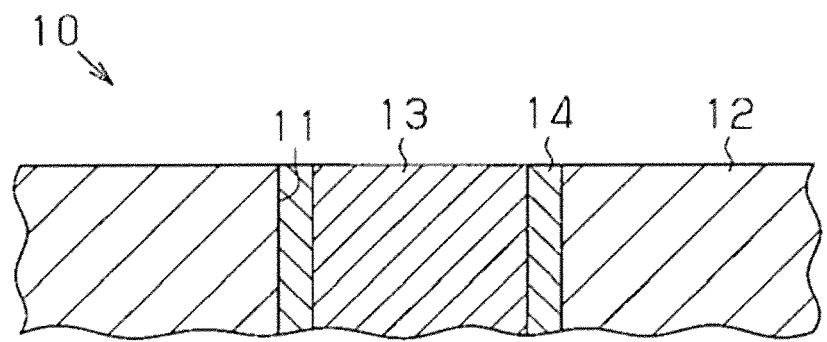
(a)
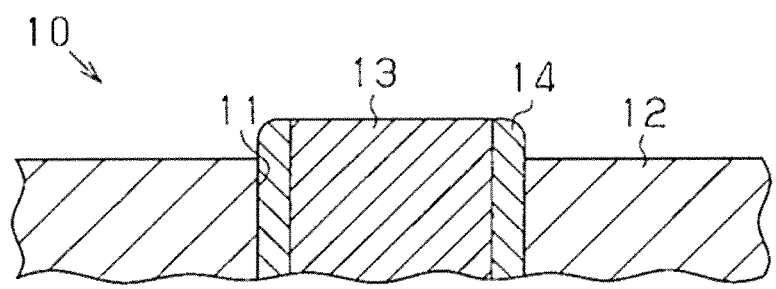
(b)

POLISHING COMPOSITION TO BE USED TO POLISH SEMICONDUCTOR SUBSTRATE HAVING SILICON THROUGH ELECTRODE STRUCTURE, AND POLISHING METHOD USING POLISHING COMPOSITION

FIELD OF THE INVENTION

The present invention relates to a polishing composition for polishing a semiconductor substrate having a through-silicon via structure such as a wafer, on which silicon and copper or a copper alloy that is a material forming an electrode are exposed, and to a method of polishing using the polishing composition.

BACKGROUND ART

The recent three-dimensional packaging technology of semiconductors in production processes of semiconductor devices employ semiconductor substrates having through-silicon via (TSV) structures. Polishing of semiconductor substrates having through-silicon via structures may be challenging because a material for a through-silicon via and silicone—a semiconductor material—are polished simultaneously and thus a feature of polishing, particularly the polishing speed or the surface accuracy after polishing, differs between the materials for through-silicon vias and silicon.

The method of polishing semiconductor substrates having through-silicon via structures has been conventionally studied. For example, Patent document 1 discloses a polishing composition containing an oxidizing agent which is hydrogen peroxide and a complexing agent. Patent document 1 discloses that using the polishing composition, contamination of silicon wafers with copper was reduced.

Meanwhile Patent document 2 discloses that using the polishing composition disclosed in Patent document 2, a silicon configuration and a conductive material configuration formed of copper can be polished at the same polishing speed of 6000 Å/min. It is disclosed that the polishing composition disclosed in Patent document 2 contains an organic alkaline compound and an oxidizing agent which is sodium chlorite or potassium bromate and that the organic alkaline compound is an amine such as ethylenediamine, diethylenetriamine, triethylenetetramine, N-(2-hydroxyethyl)ethylenediamine and 1,2-diaminopropane.

The polishing composition disclosed in Patent document 2 is formulated in order to polish, as described above, the silicon configuration and the conductive material configuration formed of copper at a similar polishing speed.

PRIOR ART DOCUMENTS

Patent Documents

Patent document 1: Japanese Patent Application Laid-open No. 2011-222715
Patent document 2: Japanese Patent Application Laid-open No. 2011-66383

DISCLOSURE OF THE INVENTION

Although use of the polishing composition disclosed in Patent document 1 in polishing of semiconductor substrates having through-silicon via structures may improve the polishing speed of the electrode material that is copper or a copper alloy due to the action of hydrogen peroxide contained therein as an oxidizing agent, a suitable polishing speed of silicon may not be obtained because hydrogen peroxide has significant action for generating oxide films on the surface of silicon. Meanwhile although Patent document 2 indicates that the method of polishing and the polishing composition disclosed therein may increase the polishing speed for both silicon and copper, it is not indicated that the polishing speed of silicon is maintained at or above a certain level while keeping the polishing speed of copper that is a certain amount lower than the polishing speed of silicon and is at or above a certain level. In addition Patent document 2 does not mention contamination of silicon in wafers with copper that may be produced by polishing in the method of polishing disclosed in Patent document 2.

Under these circumstances, an object of the present invention is to provide a polishing composition and a method of polishing using the polishing composition which allows polishing of semiconductor substrates having through-silicon via structures without reducing the polishing speed of silicon while maintaining the polishing speed of copper or a copper alloy at or above a certain level that is lower than the polishing speed of silicon, and also allows prevention of contamination of silicon with copper that may be produced by polishing of wafers.

In order to achieve the above object, the present invention provides a polishing composition containing an oxidizing agent having a standard electrode potential of 350 to 740 mV; a silicon polishing accelerating agent; a through-silicon via material polishing speed increasing agent; and water, and a method of polishing a wafer having a through-silicon via material surface such as copper or a copper alloy and a silicon surface exposed on the wafer by using the polishing composition.

The polishing composition may further contain abrasive grains. The polishing composition preferably has a pH of 9 or more.

According to the present invention, the polishing composition and the method of polishing using the polishing composition can be provided that can limit the reduction in the polishing speed of silicon that may occur during polishing of wafers having through-silicon via material surfaces such as copper or a copper alloy and silicon surfaces both of which are exposed on the wafers while maintaining the polishing speed of copper or a copper alloy at or above a certain level and can prevent contamination of silicon with copper that may be produced by polishing of wafers.

BRIEF DESCRIPTION OF THE DRAWINGS

FIG. 1 (*a*) is a section view of the surface of a wafer before polishing by the method of polishing according to an embodiment of the present invention, and FIG. 1(*b*) is a section view of an exemplary surface of a wafer after polishing by the method of polishing according to an embodiment of the present invention.

MODE FOR CARRYING OUT THE INVENTION

Embodiments of the present invention are hereinafter illustrated.

The polishing composition of the embodiment contains an oxidizing agent having a standard electrode potential of 350 mV or more and 740 mV or less; a silicon polishing accelerating agent; a through-silicon via material polishing speed increasing agent; a silicon contamination preventing agent; and water.

<Oxidizing Agent Having Standard Electrode Potential of 350 to 740 mV>

The polishing composition for chemical mechanical polishing of a wafer contains an oxidizing agent having a standard electrode potential of 350 to 740 mV. The standard electrode potential of the oxidizing agent as used herein is based on the normal hydrogen electrode (NHE) and can be determined from standard Gibbs free energy. Standard electrode potentials of general substances can be obtained from, for example, "*Kagaku Binran* (Handbook of Chemistry), Pure Chemistry", ed. The Chemical Society of Japan.

When the polishing composition contains an oxidizing agent having a standard electrode potential of higher than 740 mV, it is difficult to obtain a practical polishing speed of silicon. In order to obtain a particularly suitable practical polishing speed of silicon, the polishing composition contains the oxidizing agent having a standard electrode potential of 740 mV or less and more preferably 720 mV or less.

When the polishing composition contains an oxidizing agent having a standard electrode potential of less than 350 mV, the polishing speed of copper or a copper alloy is excessively decreased, so that the surface accuracy of copper or a copper alloy may be deteriorated. In order to maintain a particularly suitable practical polishing speed of copper or a copper alloy, the polishing composition contains the oxidizing agent having a standard electrode potential of 350 mV or more and more preferably 370 mV or more.

The content of the oxidizing agent in the polishing composition is preferably 0.001 to 5% by mass. When the content of the oxidizing agent in the polishing composition is higher than 5% by mass, a practical polishing speed of copper or a copper alloy may not be obtained. In order to obtain a particularly suitable practical polishing speed of copper or a copper alloy, the content of the oxidizing agent in the polishing composition is preferably 5% by mass or less and more preferably 3% by mass or less.

When the content of the oxidizing agent in the polishing composition is less than 0.001% by mass, the polishing speed of copper or a copper alloy is excessively decreased and the surface accuracy of copper or a copper alloy may be deteriorated. In order to maintain a particularly suitable practical polishing speed of copper or a copper alloy, the content of the oxidizing agent in the polishing composition is preferably 0.001% by mass or more and more preferably 0.005% by mass or more.

The type of the oxidizing agent in the polishing composition is not particularly limited in terms of constituent elements, structures and the like as far as it has a standard electrode potential of 350 to 740 mV. The oxidizing agent may preferably include, but is not limited to, periodic acid, perchloric acid, chlorous acid, bromic acid, persulphuric acid and salts thereof. The salts formed therefrom may include salts of alkali metals such as potassium and sodium and ammonium salts.

<Silicon Polishing Accelerating Agent>

The polishing composition of the present embodiment contains a silicon polishing accelerating agent. The silicon polishing accelerating agent acts to chemically etch silicon and chemically polish silicon. The silicon polishing accelerating agent not only suitably maintains the polishing speed of silicon but also prevents contamination of silicon with copper or a copper alloy. The silicon polishing accelerating agent in the present invention is a basic compound which hardly solubilises copper oxide, and may include compounds other than amines such as ethylenediamine, diethyleneamine, triethylenetetramine and 1,2-propanediamine. In order to further effectively exhibit the above effects, the silicon polishing accelerating agent more preferably has a pKa of 8 or higher. The compound which "hardly solubilises copper oxide" as used herein specifically refers to a basic compound which does not have an element such as a nitrogen atom coordinating with a copper ion or a basic compound having such a nitrogen atom that is surrounded by other groups, so that the compound may not coordinate with a copper ion due to steric hindrance.

Specifically, the silicon polishing accelerating agent may include a basic compound having a nitrogen atom and having a plurality of groups that covalently bind to the element to provide steric hindrance such as hydroxy, carbonyl, aldehyde, thiol, sulphonic acid, phosphonic acid, alkyl, aryl, benzyl and alkoxy groups.

The silicon polishing accelerating agent may include quaternary ammoniums and salts thereof such as tetramethylammonium hydroxide, ammonium salts such as ammonium carbonate and ammonium hydrogen carbonate, hydroxides of alkali metals such as potassium hydroxide and sodium hydroxide, carbonate salts such as potassium hydrogen carbonate, potassium carbonate, sodium hydrogen carbonate and sodium carbonate, and heterocyclic amine compounds.

All of the compounds mentioned above have a pKa of 8 or higher.

The heterocyclic amine compounds may include piperazines such as piperazine, 1-(2-aminoethyl)piperazine and N-methylpiperazine; pyridines such as pyridine, piperidine, 3-pyridinol, isonicotinic acid, picolinic acid, acetylpyridine, 4-dimethylaminopyridine, nitropyridine, 2,4,6-tris(2-pyridyl)-1,3,5-triazine [abbreviation: TPTZ], 3-(2-pyridyl)-5,6-bis(4-sulphonyl)-1,2,4-triazine [abbreviation: PDTS] and syn-phenyl-2-pyridyl ketoxime [abbreviation: PPKS]; pyrazoles such as pyrazole and 5-pyrazolone; imidazoles such as imidazole and methylimidazole; benzimidazoles such as benzimidazole and the like.

Among others, the silicon polishing accelerating agent used is preferably tetramethylammonium hydroxide, hydroxides of alkali metals and salts thereof, and particularly preferably tetramethylammonium hydroxide.

By including the silicon polishing accelerating agent in the polishing composition, desirable polishing speeds of silicon and copper can be obtained.

It is important that the silicon polishing accelerating agent used is not amines such as ethylenediamine, diethyleneamine, triethylenetetramine or 1,2-propanediamine (compounds which have a nitrogen atom coordinating with a copper ion and do not have a group attached to the nitrogen atom that may cause steric hindrance), in order to prevent contamination of silicon with copper or a copper alloy.

It is preferable to adjust the polishing composition to have a pH of 9 or higher and more preferably 10 or higher by using the silicon polishing accelerating agent. When the polishing composition is adjusted to have a pH of 9 or higher, a particularly suitable practical polishing speed of silicon can be easily obtained. It is preferable to adjust the polishing composition to have a pH of 12 or lower and more preferably 11.5 or lower. When the polishing composition has a pH of 12 or higher, the polishing composition may have decreased stability.

The content of the silicon polishing accelerating agent in the polishing composition is preferably 0.01 to 5% by mass. When the content of the silicon polishing accelerating agent in the polishing composition is less than 0.01% by mass, a practical polishing speed of silicon may not be obtained. In order to obtain a particularly suitable practical polishing speed of silicon, the content of the silicon polishing accelerating agent in the polishing composition is preferably 0.01% by mass or more and more preferably 0.1% by mass or more.

When the content of the silicon polishing accelerating agent in the polishing composition is more than 5% by mass, the abrasive grains described hereinafter may be easily gelated, resulting in decreased stability of the polishing composition and a deteriorated polishing speed of silicon. In order to maintain a particularly suitable practical polishing speed of silicon, it is preferable that the content of the silicon polishing accelerating agent in the polishing composition is 5% by mass or less and more preferably 1% by mass or less.

<Through-Silicon Via Material Polishing Speed Increasing Agent>

The polishing composition of the present embodiment contains a through-silicon via material polishing speed increasing agent.

The through-silicon via material polishing speed increasing agent (hereinafter also merely referred to as "increasing agent") is a compound that has complexing action towards copper and copper oxide, has substantially no solubility of silicon and has low stabilization action of a complex formed with a copper ion. More specifically the increasing agent is preferably a compound having at least one and more preferably two or more oxygen atoms that serve as ligands for forming a complex with a copper ion and having a complex stability constant of a complex formed with a copper ion of less than 10 and more preferably less than 8.

An increasing agent having at least one oxygen atom that serves as a ligand for forming a complex with copper does not solubilize silicon because the increasing agent forms a complex with a copper ion and thus does not react with the silicon surface, and an increasing agent having a complex stability constant of less than 10 allows the complex in the polishing composition to release a copper ion during polishing, resulting in a suitable polishing speed of copper or a copper alloy. The complex stability constant of a complex formed with a copper ion can be determined by using the values described in Stability Constants of Metal-Ion Complexes, Part B: Organic Ligands (IUPAC Publications).

The polishing speed increasing agent may specifically include amino acids and salts thereof such as arginine, histidine, glycine, alanine and asparagine; monocarboxylic acids and salts thereof such as formic acid, acetic acid, propionic acid, butyric acid, isobutyric acid, decanoic acid, dodecanoic acid, benzoic acid and phenylacetic acid; polycarboxylic acids and salts thereof such as oxalic acid, malonic acid, succinic acid, maleic acid and fumaric acid; hydroxycarboxylic acids and salts thereof such as glycolic acid, gluconic acid, lactic acid, hydroxybutyric acid, hydroxyacetic acid, hydroxybenzoic acid, salicylic acid, tartronic acid, malic acid, tartaric acid and citric acid; phenols such as phenol, cresol, catechol and resorcinol; and polyoxo compounds such as glyoxal, malonaldehyde, diacetyl, acetylacetone and pyruvic aldehyde.

The counter ion for formation of salts may include alkali metal ions such as potassium and sodium ions, alkaline earth metal ions such as calcium, magnesium and barium ions and non-metal ions such as an ammonium ion.

Among others, monocarboxylic acids and salts thereof, polycarboxylic acids and salts thereof, hydroxycarboxylic acids and salts thereof, amino acids and salts thereof and polyoxo compounds are preferred and monocarboxylic acids and salts thereof, polycarboxylic acids and salts thereof and hydroxycarboxylic acids and salts thereof are particularly preferred.

By using such compounds, the polishing speed of copper and a copper alloy can be maintained at or above a certain level and can be kept at or below a certain range relative to the polishing speed of silicon.

The content of the through-silicon via material polishing speed increasing agent in the polishing composition may be appropriately adjusted according to the type of the adjusting agent used, and is generally 5% by mass or less, and is generally 0.005% by mass or more, and preferably 0.005% by mass or more and 0.5% by mass or less, still more preferably 0.01% by mass or more and 0.3% by mass or less and particularly preferably 0.01% by mass or more and 0.1% by mass or less. The above content is preferable because the polishing speed of copper and a copper alloy which is a through-silicon via material can be maintained at or above a certain level and can be kept at a level that is a certain amount lower than the polishing speed of silicon.

<Silicon Contamination Preventing Agent>

The polishing composition of the present embodiment contains a silicon contamination preventing agent (hereinafter also merely referred to as "contamination preventing agent") for preventing contamination of silicon on a wafer.

Inclusion of the silicon contamination preventing agent allows prevention of contamination of silicon on a wafer with copper and a copper alloy produced by polishing.

The silicon contamination preventing agent in the present invention is a compound that exhibits complexing action towards copper released by polishing although it does not solubilise copper or copper oxide which is not free, has substantially no solubility of silicon, and has a stabilization action of a complex formed with a copper ion that is higher than that of the through-silicon via material polishing speed increasing agent. The combined use thereof with the silicon polishing accelerating agent of the present invention can synergistically improve the effect for prevention of contamination of silicon. Namely use of the substance which hardly solubilises copper or copper oxide as the silicon polishing accelerating agent allows reduction in the absolute amount of contaminating substances and the silicon contamination preventing agent further captures the contaminating substances, and thus these substances synergistically exhibit the effect of prevention of contamination.

More specifically a compound having at least two and more preferably four or more oxygen atoms that serve as ligands for forming a complex with a copper and having a complex stability constant of a complex formed with a copper ion of 10 or more is preferred. More preferably the compound has a complex stability constant of a complex formed with a copper ion of 15 or more and particularly preferably 18 or more.

The silicon contamination preventing agent may specifically include iminocarboxylic acids such as iminodiacetic acid [abbreviation: IDA], nitrilotriacetic acid [abbreviation: NTA], ethylenediaminediacetic acid [abbreviation: EDDA], ethylenediaminetetraacetic acid [abbreviation: EDTA], trans-1,2-diaminocyclohexanetetraacetic acid [abbreviation: CyDTA], diethylenetriaminepentaacetic acid [abbreviation: DTPA], triethylenetetraminehexaacetic acid [abbreviation: TTHA], 1,6-hexamethylenediaminetetraacetic acid [abbreviation: HDTA], ethylenediamine diorthohydroxyphenylacetic acid [abbreviation: EDDHA], ethylenediamine-N,N'-bis[(2-hydroxy-5-methylphenyl)acetic acid] [abbreviation: EDDHMA] and N,N-bis(2-hydroxybenzyl)ethylenediamine-N,N-diacetic acid [abbreviation: HBED]; phosphonic acids such as nitrilotris(methylenephosphonic acid) [abbreviation: NTMP], 1-hydroxyethylidene-1,1-diphosphonic acid [abbreviation: HEDP], methanehydroxyphosphonic acid and α-methylphosphonosuccinic acid; and iminophosphonic acids such as ethylenediaminetetrakis(methylenephosphonic acid) [abbreviation: EDTPO], ethylenediamine- N,N'-bis[(2-hydroxy-5-methylphenyl)phosphonic acid] and ethylenediamine-N,N'-bis[(2-hydroxy-5-phosphophenyl)phosphonic acid].

Among others, it is preferable to use a compound selected from iminocarboxylic acids and iminophosphonic acids, and among iminocarboxylic acids, triethylenetetraminehexaacetic acid is particularly preferred and among iminophosphonic acids, ethylenediaminetetrakis(methylenephosphonic acid) is particularly preferred.

The content of the silicon contamination preventing agent in the polishing composition may be appropriately adjusted according to the type of the contamination preventing agent used, and is generally 0.01% by mass or more in view of securing the effect of prevention of contamination and is generally 10% by mass or less in view of the cost. The content of the contamination preventing agent is preferably 0.05% by mass or more.

The polishing composition of the present embodiment contains water. Water serves as a dispersing medium and a solvent and mixes, solubilises and dilutes the components in the polishing composition. Water used preferably contains a low amount of impurities and specifically water is preferably the one obtained by filtration of ion-exchange water, or distilled water. The content of water in the polishing composition is appropriately adjusted according to the content of the components other than water in the polishing composition.

Preferably the polishing composition further contains abrasive grains that mechanically polish a wafer. The abrasive grains may specifically include silica such as colloidal silica, fumed silica and sol-gel silica, and, alumina, titania, zirconia, celia and the like. Among the abrasive grains, colloidal silica is preferred.

The abrasive grains in the polishing composition preferably have an average primary particle diameter of 5 to 1,000 nm, more preferably 5 to 500 nm and still more preferably 10 to 200 nm.

The average primary particle diameter as used herein can be determined from the specific surface area measured by the BET method.

The content of the abrasive grains in the polishing composition is preferably 0.1% by mass or more, more preferably 0.5% by mass or more and still more preferably 1.0% by mass or more. When the content of the abrasive grains is within the above range, a particularly suitable practical polishing speed of silicon can be easily obtained.

The content of the abrasive grains in the polishing composition is preferably 20% by mass or less and more preferably 10% by mass or less. By decreasing the content of the abrasive grains, dispersibility of the abrasive grains in the polishing composition is improved.

The polishing speed of silicon with the polishing composition is preferably 3,500 Å/min or more, more preferably 4,400 Å/min or more and particularly preferably 4,500 Å/min or more. When the polishing speed of silicon with the polishing composition is 3,500 Å/min or more, a practical polishing speed can be obtained particularly for polishing of a wafer having a through-silicon via (TSV) structure.

The polishing speed of copper or a copper alloy with the polishing composition is, in order to maintain the surface accuracy of copper or a copper alloy, generally 400 Å/min or more and more preferably 500 Å/min or more. Particularly for polishing of a wafer having a through-silicon via (TSV) structure, the polishing speed of copper or a copper alloy may be adjusted depending on the structure of the through-silicon via (TSV).

Particularly in polishing of a semiconductor substrate having a through-silicon via (TSV) structure, in order to maintain low polishing speed of copper or a copper alloy which is a wiring material while not reducing but maintaining or increasing the polishing speed of silicon which is a semiconductor material to form a specific through-silicon via (TSV) structure such as a wafer having a projected portion of copper or a copper alloy formed on the surface of the wafer, the polishing speed ratio that is obtained by dividing the polishing speed of copper or a copper alloy with the polishing composition by the polishing speed of silicon is preferably 0.08 or more and less than 0.585 and more preferably 0.09 or more and 0.30 or less.

In the method of polishing according to the present embodiment, the polishing composition of the above embodiment is used for chemical mechanical polishing of a semiconductor substrate having a through-silicon via structure. A wafer 10 shown in FIG. 1(a) includes a silicon substrate 12 having a via 11 and a conductor 13 formed of copper or a copper alloy filling the via 11, and has an exposed copper or copper alloy surface and a silicon surface. The via 11 has a barrier metal film 14 on the wall thereof in order to prevent diffusion of copper atoms of the conductor 13 to the silicon substrate 12. The barrier metal film 14 is formed from, for example, tantalum, tantalum nitride or titanium nitride.

Chemical mechanical polishing of a wafer is carried out in order to, for example, polish both the copper or copper alloy surface and the silicon surface of the wafer to flatten the surface of the wafer or to relieve the stress or to mainly polish the silicon surface to form, as shown in FIG. 1(b) for example, a projected portion of copper or a copper alloy on the surface of the wafer. The shape of the surface of the wafer after polishing is not limited to the one shown in FIG. 1(b).

Chemical mechanical polishing of a wafer can be carried out on a conventional polishing machine including a polishing platen having a polishing pad attached thereto.

The polishing pressure during chemical mechanical polishing of a wafer, i.e., the contact pressure of a polishing pad against the wafer, is preferably 3 to 100 kPa and more preferably 10 to 40 kPa.

The rotation speed of the polishing platen during chemical mechanical polishing of a wafer is preferably 20 to 1000 rpm and more preferably 30 to 600 rpm.

The amount of the polishing composition fed to the polishing pad during chemical mechanical polishing of a wafer, i.e., the feeding rate, is preferably 50 to 2000 mL/min and more preferably 100 to 500 mL/min.

The present embodiments provide the following advantages:

In the method of polishing of the present embodiment, the polishing composition of the present embodiment including the oxidizing agent having a standard electrode potential of 350 to 740 mV; the silicon polishing accelerating agent; the through-silicon via material polishing speed increasing agent; the silicon contamination preventing agent; and water is used for polishing of a wafer having a through-silicon via material surface such as copper or a copper alloy and a silicon surface both of which are exposed on the wafer. In this case, the polishing speed of silicon and the polishing speed of copper and a copper alloy obtained are practically suitable. It is predicted that when the oxidizing agent used has the standard electrode potential higher than the above range, an oxide film is generated on the silicon surface and polishing by means of chemical polishing action may be prevented.

On the other hand, when the oxidizing agent used has the standard electrode potential lower than the above range, copper or a copper alloy may not be sufficiently oxidised and thus it is difficult to obtain a practically required polishing speed of copper or a copper alloy.

Particularly when the polishing composition of the present embodiment is used in the method of polishing of the present embodiment in which silicon and a through-silicon via material such as copper or a copper alloy are simultaneously polished, the polishing speed of silicon and the polishing speed of copper or a copper alloy can be controlled so as to have the desired ratio as described above. Thus it becomes possible to maintain the polishing speed of silicon at or above a certain level while maintaining the polishing speed of copper or a copper alloy at or above a certain level and keeping the polishing speed of copper or a copper alloy at a level that is a certain amount lower than the polishing speed of silicon, which could not have been achieved with conventional polishing compositions.

Moreover use of the polishing composition of the present embodiment can sufficiently prevent contamination of silicon on a wafer, which problem has not been conventionally recognized in methods for polishing in which silicon and a through-silicon via material such as copper or a copper alloy are simultaneously polished.

Particularly it is now found that not only inclusion of the silicon contamination preventing agent but also substantial exclusion of an amine such as ethylenediamine, diethyleneamine, triethylenetetramine and 1,2-propanediamine from the polishing composition of the present embodiment is effective for prevention of contamination of silicon on a wafer. The phrase "substantial exclusion" as used herein means that the content of the amine in the polishing composition is less than 0.0001% by mass.

The above embodiments may be modified as follows:

The polishing composition of the above embodiment may contain two or more types of abrasive grains.

The polishing composition of the above embodiment may contain two or more types of silicon polishing accelerating agents.

The polishing composition of the above embodiment may contain two or more types of inorganic electrolytes.

The polishing composition of the above embodiment may contain two or more types of through-silicon via material polishing speed increasing agents.

The polishing composition of the above embodiment may contain two or more types of oxidizing agents.

The polishing composition of the above embodiment may contain, if necessary, an additive such as a water soluble polymer, a surfactant, a preservative, a fungicide, a corrosion inhibitor and the like.

The polishing composition of the above embodiment may be prepared by diluting a stock solution of the polishing composition with water.

The polishing composition of the above embodiment may be of one-component or of multi-component typically including two-component. For example, the polishing composition may be prepared by mixing a first agent at least containing the oxidizing agent having a standard electrode potential of 350 to 740 mV and a second agent containing the silicon polishing accelerating agent, the through-silicon via material polishing speed increasing agent and optionally another additive.

The polishing composition of the above embodiment may be used on a conventional polishing machine including a polishing platen having a polishing pad attached thereto. The polishing composition may be used in a so-called throwaway manner in which the composition is disposed once it is used for polishing, or may be repetitively used by circulation. In an example of a method of circulating the polishing composition, the polishing composition after use discharged from a polishing machine is recovered in a tank and the recovered polishing composition is fed again to the polishing machine.

The circulation of the polishing composition can reduce the amount of the used polishing composition disposed as waste compared to the use thereof in a throwaway manner, leading to reduction of environmental burdens and can reduce the amount of the required polishing composition, leading to reduction of cost.

Chemical mechanical polishing in the method of polishing of the above embodiment may be carried out by feeding the polishing composition to a polishing pad containing abrasive grains such as celia, silica, alumina and resins. In this case, the polishing composition used may be free from the abrasive grains.

The semiconductor substrate having a through-silicon via structure which is a subject of the method of polishing of the above embodiment may include not only those containing copper or a copper alloy as an electrode material but also those alternatively containing a material that is generally used as a wiring material for semiconductor substrates such as aluminium and tungsten. Thus the polishing composition of the above embodiment can also be applied to polishing of a semiconductor substrate containing a general wiring material used for a semiconductor substrate such as aluminium and tungsten as a material of a through-silicon via.

Examples and Comparative Examples of the present invention are hereinafter illustrated.

Colloidal silica as abrasive grains, an oxidizing agent, a silicon polishing accelerating agent, a through-silicon via material polishing speed increasing agent and a silicon contamination preventing agent shown in Table 1 were mixed in water to prepare polishing compositions of Examples 1 to 23 and Comparative Examples 1 to 16. The standard electrode potential of the oxidizing agent and the content of the components in the polishing compositions of the Examples 1 to 23 and Comparative Examples 1 to 16 are also shown in Table 1.

In the column "Silicon polishing speed" in Table 2, the polishing speed of silicon is shown which was obtained when the surface of a 32-mm square silicon wafer was polished with the respective polishing compositions under the conditions shown in Table 3. The polishing speed of silicon was determined by dividing the difference in the weight of the wafer before and after polishing which was measured on a precision balance "AG-285" from METTLER TOLEDO by the polishing period (15 min). In the column "Silicon polishing speed" in Table 2, "O" indicates the polishing speed of 3500 Å/min or more and "x" indicates the polishing speed that is less than 3500 Å/min.

In the column "Copper polishing speed" in Table 2, the polishing speed of copper is shown which was obtained when the surface of a 32-mm square 5000-Å blanket copper wafer was polished with the respective polishing compositions under the conditions shown in Table 3. The polishing speed of copper was determined by dividing the difference in the weight of the wafer before and after polishing which was measured on a precision balance "AG-285" from METTLER TOLEDO by the polishing period (1 min). In the column "Copper polishing speed" in Table 2, "O" indicates the polishing speed of 400 Å/min or more and "x" indicates the polishing speed that is less than 400 Å/min.

In the column "Contamination" in Table 2, four 6-inch silicon wafers and a 12-inch wafer with 5000-A Cu film were polished with the respective polishing compositions of Examples and Comparative Examples under the conditions shown in Table 4, metal on the surface of the polished silicon wafers were recovered according to the method indicated in Table 5 and the copper atom concentration in the recovered solution was measured on ICP-MS "Agilent 4500" from Agilent Technologies. The measured copper atom concentration was converted to the number of atoms (atoms/cm$^2$) per area of the wafer to determine the contamination concentration. In the column "Contamination" in Table 2, "O" indicates the contamination concentration of 1E+11 atoms/cm$^2$ or less and "x" indicates the contamination concentration that is higher than 1E+11 atoms/cm$^2$.

TABLE 1

| | Abrasive grains (silica) | | Oxidizing agent | | |
|---|---|---|---|---|---|
| | Average primary particle diameter | Content (mass %) | Type | Standard potential (mV) | Content (mass %) |
| Ex. 1 | 50 nm | 2 | Sodium chlorite | 681 | 0.20 |
| Ex. 2 | 50 nm | 2 | Sodium chlorite | 681 | 0.30 |
| Ex. 3 | 50 nm | 2 | Sodium chlorite | 681 | 0.50 |
| Ex. 4 | 50 nm | 2 | Sodium chlorite | 681 | 1.00 |
| Ex. 5 | 50 nm | 2 | Sodium chlorite | 681 | 0.20 |
| Ex. 6 | 50 nm | 2 | Sodium chlorite | 681 | 0.20 |
| Ex. 7 | 35 nm | 2 | Sodium chlorite | 681 | 0.20 |
| Ex. 8 | 12 nm | 2 | Sodium chlorite | 681 | 0.20 |
| Ex. 9 | 50 nm | 2 | Perchloric acid | 374 | 0.20 |
| Ex. 10 | 50 nm | 2 | Ammonium persulphate | 450 | 0.45 |
| Ex. 11 | 50 nm | 2 | Orthoperiodic acid | 700 | 0.45 |
| Ex. 12 | 50 nm | 2 | Sodium bromate | 491 | 0.30 |
| Ex. 13 | 50 nm | 2 | Ammonium persulphate | 450 | 0.45 |
| Ex. 14 | 35 nm | 2 | Sodium chlorite | 681 | 0.20 |
| Ex. 15 | 35 nm | 2 | Sodium chlorite | 681 | 0.20 |
| Ex. 16 | 35 nm | 2 | Sodium chlorite | 681 | 0.20 |
| Ex. 17 | 35 nm | 2 | Sodium chlorite | 681 | 0.20 |
| Ex. 18 | 35 nm | 2 | Sodium chlorite | 681 | 0.20 |
| Ex. 19 | 50 nm | 2 | Sodium chlorite | 681 | 0.20 |
| Ex. 20 | 50 nm | 2 | Sodium chlorite | 681 | 0.20 |
| Ex. 21 | 50 nm | 2 | Sodium chlorite | 681 | 0.20 |
| Ex. 22 | 50 nm | 2 | Sodium chlorite | 681 | 0.20 |
| Ex. 23 | 50 nm | 2 | Sodium chlorite | 681 | 0.20 |
| Comp. Ex. 1 | 50 nm | 2 | None | — | — |
| Comp. Ex. 2 | 50 nm | 2 | Sodium chlorite | 681 | 0.20 |
| Comp. Ex. 3 | 50 nm | 2 | Hydrogen peroxide | 1770 | 0.10 |
| Comp. Ex. 4 | 50 nm | 2 | Sodium hypochlorite | 890 | 0.15 |
| Comp. Ex. 5 | 50 nm | 2 | Potassium permanganate | 750 | 0.30 |
| Comp. Ex. 6 | 50 nm | 2 | Sodium chlorate | 295 | 0.20 |
| Comp. Ex. 7 | 50 nm | 2 | Sodium iodate | 150 | 0.40 |
| Comp. Ex. 8 | 50 nm | 2 | Sodium chlorite | 681 | 0.20 |
| Comp. Ex. 9 | 50 nm | 2 | Sodium chlorite | 681 | 0.20 |
| Comp. Ex. 10 | 50 nm | 2 | Sodium chlorite | 681 | 0.20 |
| Comp. Ex. 11 | 50 nm | 2 | Sodium chlorite | 681 | 0.20 |
| Comp. Ex. 12 | 50 nm | 2 | None | — | — |
| Comp. Ex. 13 | 50 nm | 2 | None | — | — |
| Comp. Ex. 14 | 50 nm | 2 | None | — | — |
| Comp. Ex. 15 | 50 nm | 2 | None | — | — |
| Comp. Ex. 16 | 50 nm | 2 | None | — | — |

| | Silicon polishing accelerating agent | | Through-silicon via material polishing speed adjusting agent | | Silicon contamination preventing agent | |
|---|---|---|---|---|---|---|
| | Type | Content (mass %) | Type | Content (mass %) | Type | Content (mass %) |
| Ex. 1 | TMAH | 0.45 | Ammonium citrate | 0.02 | EDTA | 0.10 |
| Ex. 2 | TMAH | 0.45 | Ammonium citrate | 0.02 | EDTA | 0.10 |
| Ex. 3 | TMAH | 0.45 | Ammonium citrate | 0.02 | EDTA | 0.10 |
| Ex. 4 | TMAH | 0.45 | Ammonium citrate | 0.02 | EDTA | 0.10 |
| Ex. 5 | TMAH | 0.45 | Glycine | 0.02 | EDTA | 0.10 |
| Ex. 6 | TMAH | 0.45 | Glycine | 0.20 | EDTA | 0.10 |
| Ex. 7 | TMAH | 0.45 | Glycine | 0.02 | EDTA | 0.10 |
| Ex. 8 | TMAH | 0.45 | Glycine | 0.02 | EDTA | 0.10 |
| Ex. 9 | TMAH | 0.45 | Ammonium citrate | 0.02 | EDTA | 0.10 |
| Ex. 10 | TMAH | 0.45 | Ammonium citrate | 0.02 | EDTA | 0.10 |
| Ex. 11 | TMAH | 0.45 | Ammonium citrate | 0.02 | EDTA | 0.10 |
| Ex. 12 | TMAH | 0.45 | Ammonium citrate | 0.02 | EDTA | 0.10 |
| Ex. 13 | TMAH | 0.45 | Ammonium citrate | 0.02 | EDTA | 0.10 |
| Ex. 14 | TMAH | 0.45 | Glycine | 0.02 | DTPA | 0.10 |
| Ex. 15 | TMAH | 0.45 | Glycine | 0.02 | EDDA | 0.10 |
| Ex. 16 | TMAH | 0.45 | Glycine | 0.02 | EDTPO | 0.10 |
| Ex. 17 | TMAH | 0.45 | Glycine | 0.02 | EDDHA | 0.10 |
| Ex. 18 | TMAH | 0.45 | Glycine | 0.02 | NTA | 0.10 |
| Ex. 19 | KOH | 0.45 | Ammonium citrate | 0.02 | EDTA | 0.10 |
| Ex. 20 | K$_2$CO$_3$ | 0.45 | Ammonium citrate | 0.02 | EDTA | 0.10 |
| Ex. 21 | NaOH | 0.45 | Ammonium citrate | 0.02 | EDTA | 0.10 |
| Ex. 22 | Na$_2$CO$_3$ | 0.45 | Ammonium citrate | 0.02 | EDTA | 0.10 |
| Ex. 23 | Piperazine | 0.45 | Ammonium citrate | 0.02 | EDTA | 0.10 |

TABLE 1-continued

| | | | | | | |
|---|---|---|---|---|---|---|
| Comp. Ex. 1 | TMAH | 0.45 | Ammonium citrate | 0.02 | EDTA | 0.10 |
| Comp. Ex. 2 | TMAH | 0.45 | Ammonium citrate | 0.02 | — | — |
| Comp. Ex. 3 | TMAH | 0.45 | Ammonium citrate | 0.02 | EDTA | 0.10 |
| Comp. Ex. 4 | TMAH | 0.45 | Ammonium citrate | 0.02 | EDTA | 0.10 |
| Comp. Ex. 5 | TMAH | 0.45 | Ammonium citrate | 0.02 | EDTA | 0.10 |
| Comp. Ex. 6 | TMAH | 0.45 | Ammonium citrate | 0.02 | EDTA | 0.10 |
| Comp. Ex. 7 | TMAH | 0.45 | Ammonium citrate | 0.02 | EDTA | 0.10 |
| Comp. Ex. 8 | Ethylenediamine | 0.45 | — | — | EDTA | 0.10 |
| Comp. Ex. 9 | Diethylenetriamine | 0.45 | — | — | EDTA | 0.10 |
| Comp. Ex. 10 | Triethylenetetramine | 0.45 | — | — | EDTA | 0.10 |
| Comp. Ex. 11 | 1,2-propanediamine | 0.45 | — | — | EDTA | 0.10 |
| Comp. Ex. 12 | KOH | 0.45 | Ammonium citrate | 0.02 | EDTA | 0.10 |
| Comp. Ex. 13 | $K_2CO_3$ | 0.45 | Ammonium citrate | 0.02 | EDTA | 0.10 |
| Comp. Ex. 14 | NaOH | 0.45 | Ammonium citrate | 0.02 | EDTA | 0.10 |
| Comp. Ex. 15 | $Na_2CO_3$ | 0.45 | Ammonium citrate | 0.02 | EDTA | 0.10 |
| Comp. Ex. 16 | Piperazine | 0.45 | Ammonium citrate | 0.02 | EDTA | 0.10 |

*TMAH: tetramethylammonium hydroxide, EDTA: ethylenediaminetetraacetic acid, DTPA: diethylenetriaminepentaacetic acid, EDDA: ethylenediaminediacetic acid, EDDHA: ethylenediamine diorthohydroxyphenylacetic acid, NTA: nitrilotriacetic acid

TABLE 2

| | Evaluation | | | Copper polishing speed/silicon polishing speed |
|---|---|---|---|---|
| | Silicon polishing speed (Å/min.) | Copper polishing speed (Å/min.) | Contamination | |
| Ex. 1 | 4597 ○ | 569 ○ | ○ | 0.124 |
| Ex. 2 | 4683 ○ | 639 ○ | ○ | 0.136 |
| Ex. 3 | 4793 ○ | 753 ○ | ○ | 0.157 |
| Ex. 4 | 4994 ○ | 878 ○ | ○ | 0.176 |
| Ex. 5 | 4602 ○ | 864 ○ | ○ | 0.188 |
| Ex. 6 | 4589 ○ | 1353 ○ | ○ | 0.295 |
| Ex. 7 | 4526 ○ | 835 ○ | ○ | 0.184 |
| Ex. 8 | 4467 ○ | 814 ○ | ○ | 0.182 |
| Ex. 9 | 4974 ○ | 469 ○ | ○ | 0.094 |
| Ex. 10 | 4513 ○ | 2624 ○ | ○ | 0.582 |
| Ex. 11 | 4804 ○ | 935 ○ | ○ | 0.195 |
| Ex. 12 | 4553 ○ | 434 ○ | ○ | 0.095 |
| Ex. 13 | 5102 ○ | 2714 ○ | ○ | 0.532 |
| Ex. 14 | 4526 ○ | 835 ○ | ○ | 0.184 |
| Ex. 15 | 4526 ○ | 835 ○ | ○ | 0.184 |
| Ex. 16 | 4526 ○ | 835 ○ | ○ | 0.184 |
| Ex. 17 | 4526 ○ | 835 ○ | ○ | 0.184 |
| Ex. 18 | 4526 ○ | 835 ○ | ○ | 0.184 |
| Ex. 19 | 3758 ○ | 534 ○ | ○ | 0.142 |
| Ex. 20 | 4784 ○ | 553 ○ | ○ | 0.116 |
| Ex. 21 | 3678 ○ | 546 ○ | ○ | 0.148 |
| Ex. 22 | 4686 ○ | 538 ○ | ○ | 0.115 |
| Ex. 23 | 5385 ○ | 598 ○ | ○ | 0.111 |
| Comp. Ex. 1 | 4330 ○ | 366 X | ○ | 0.085 |
| Comp. Ex. 2 | 4584 ○ | 549 ○ | X | 0.120 |
| Comp. Ex. 3 | 2480 X | 450 ○ | ○ | 0.181 |
| Comp. Ex. 4 | 2557 X | 313 X | ○ | 0.123 |
| Comp. Ex. 5 | 350 X | 558 ○ | ○ | 1.594 |
| Comp. Ex. 6 | 4310 ○ | 276 X | ○ | 0.064 |
| Comp. Ex. 7 | 4350 ○ | 365 X | ○ | 0.084 |
| Comp. Ex. 8 | 6987 ○ | 4772 ○ | X | 0.683 |
| Comp. Ex. 9 | 6337 ○ | 3645 ○ | X | 0.575 |
| Comp. Ex. 10 | 6893 ○ | 4364 ○ | X | 0.633 |
| Comp. Ex. 11 | 6552 ○ | 3542 ○ | X | 0.541 |
| Comp. Ex. 12 | 3685 ○ | 354 X | ○ | 0.096 |
| Comp. Ex. 13 | 4565 ○ | 347 X | ○ | 0.076 |
| Comp. Ex. 14 | 3564 ○ | 336 X | ○ | 0.094 |
| Comp. Ex. 15 | 4474 ○ | 345 X | ○ | 0.077 |
| Comp. Ex. 16 | 5175 ○ | 384 X | ○ | 0.074 |

TABLE 3

Polishing machine: Desktop polishing machine "EJ-380IN" from Engis Japan Corporation
Polishing pressure: 30 kPa
Platen rotation speed: 40 rpm
Polishing pad: "SUBA 400" from Nitta Haas Incorporated
Feeding rate of polishing composition: 50 mL/min.
Temperature of polishing composition: 25° C.

TABLE 4

Polishing machine: "SPM-15" from Fujikoshi Machinery Corp.
Polishing pressure: 10 kPa
Platen rotation speed: 58 rpm
Polishing pad: "SUBA 400" from Nitta Haas Incorporated
Feeding rate of polishing composition: 500 mL/min.
Polishing period: 5 minutes
Temperature of polishing composition: 25° C.
Plate 1: one 12-inch Cu 5000-A blanket wafer is wet mounted
Plate 2: four 6-inch Si wafers are wet mounted

TABLE 5

Procedure 1: Silicon wafers respectively having a diameter of 6 inches are immersed in a cleaning solution of ammonia/hydrogen peroxide/ultrapure water = 1/1/8 heated to 60° C. for 3 minutes, rinsed under running water and dried by spin cleaning.
Procedure 2: The wafers treated in Procedure 1 are exposed to hydrofluoric acid vapour for 6 minutes.
Procedure 3: The wafers treated in Procedure 2 are mounted on a rotary surface recovery device and metal on the wafers is recovered with 0.25 mL of a recovery solution of hydrogen peroxide/hydrofluoric acid/ultrapure water = 5/5/90.

Table 2 shows that when the polishing compositions of Examples 1 to 23 containing the oxidizing agent having a standard electrode potential in the range of 350 to 740 mV, the silicon polishing accelerating agent, the through-silicon via material polishing speed increasing agent and water is used, the polishing speed of silicon obtained with all compositions was as high as about 3,670 Å/min or more, the polishing speed of copper was about 430 to 2630 Å/min and the ratio between the polishing speed of silicon and the polishing speed of copper (copper polishing speed/silicon polishing speed) was 0.095 to 0.532. Preferable effect of prevention of contamination was obtained for all Examples. On the other hand, when the polishing compositions of Comparative Examples 3 to 5 were used, the polishing speed of silicon obtained was not practical. When the polishing compositions of Comparative Examples 1, 4, 6, 7 and 12 to 16 were used, the polishing speed of copper obtained was not practical. When the polishing compositions of Comparative Examples 2 and 8 to 11 were used, contamination of silicon on wafers was confirmed. Accordingly the polishing compositions of Comparative Examples 1 to 16 were not practical polishing compositions.

The invention claimed is:

1. A polishing composition used for polishing a semiconductor substrate having a through-silicon via structure, the composition comprising:
    an oxidizing agent having a standard electrode potential of 350 mV or more and 740 mV or less;
    a silicon polishing accelerating agent;
    a through-silicon via material polishing speed increasing agent;
    a silicon contamination preventing agent; and
    water; and
    wherein
    the silicon polishing accelerating agent is a basic compound having a pKa of 8 or higher,
    the through-silicon via material polishing speed increasing agent is a compound that serves as a ligand for forming a complex with a copper ion, contains at least one oxygen atom serving as a ligand and has a complex stability constant of a complex formed with a copper ion of less than 10,
    the silicon contamination preventing agent contains at least two oxygen atoms serving as ligands for forming a complex with copper and has a complex stability constant of a complex formed with a copper ion of 10 or more.

2. The polishing composition according to claim 1, wherein the silicon polishing accelerating agent is one or more selected from tetramethylammonium hydroxide, potassium hydroxide, sodium hydroxide and piperazine.

3. The polishing composition according to claim 1, wherein the through-silicon via material polishing speed increasing agent is one or more selected from a monocarboxylic acid and a salt thereof, a polycarboxylic acid and a salt thereof, a hydroxycarboxylic acid and a salt thereof, an amino acid and a salt thereof and a polyoxo compound.

4. The polishing composition according to claim 1, wherein the content of the through-silicon via material polishing speed increasing agent is 0.005% by mass or more and 0.5% by mass or less.

5. The polishing composition according to claim 1, wherein the silicon contamination preventing agent is selected from an iminocarboxylic acid and an iminophosphonic acid.

6. The polishing composition according to claim 1, the silicon polishing accelerating agent is selected from tetramethylammonium hydroxide, ammonium carbonate and ammonium hydrogen carbonate, potassium hydroxide and sodium hydroxide, potassium hydrogen carbonate, potassium carbonate, sodium hydrogen carbonate and sodium carbonate, and heterocyclic amine compounds.

7. The polishing composition according to claim 1, the polishing speed increasing agent is selected from arginine, histidine, glycine, alanine and asparagine, formic acid, acetic acid, propionic acid, butyric acid, isobutyric acid, decanoic acid, dodecanoic acid, benzoic acid and phenylacetic acid, oxalic acid, malonic acid, succinic acid, maleic acid and fumaric acid, glycolic acid, gluconic acid, lactic acid, hydroxybutyric acid, hydroxyacetic acid, hydroxybenzoic acid, salicylic acid, tartronic acid, malic acid, tartaric acid and citric acid, phenol, cresol, catechol and resorcinol, glyoxal, malonaldehyde, diacetyl, acetylacetone and pyruvic aldehyde.

8. The polishing composition according to claim 1, the silicon contamination preventing agent is selected from iminodiacetic acid, nitrilotriacetic acid, ethylenediaminediacetic acid, ethylenediaminetetraacetic acid, trans-1,2-diaminocyclohexanetetraacetic acid, diethylenetriaminepentaacetic acid, triethylenetetraminehexaacetic acid, 1,6-hexamethylenediaminetetraacetic acid, ethylenediamine diorthohydroxyphenylacetic acid, ethylenediamine-N,N'-bis[(2-hydroxy-5-methylphenyl)acetic acid] and N,N-bis(2-hydroxybenzyl)ethylenediamine-N,N-diacetic acid; phosphonic acids such as nitrilotris(methylenephosphonic acid), 1-hydroxyethylidene-1,1-diphosphonic acid, methanehydroxyphosphonic acid and α-methylphosphonosuccinic acid; and iminophosphonic acids such as ethylenediaminetetrakis(methylenephosphonic acid), ethylenediamine-N,N'-bis[(2-hydroxy-5-methylphenyl)phosphonic acid] and ethylenediamine-N,N'-bis[(2-hydroxy-5-phosphophenyl)phosphonic acid].

9. A method of polishing a semiconductor substrate having a through-silicon via structure, using a polishing composition containing an oxidizing agent having a standard electrode potential of 350 mV or more and 740 mV or less; a silicon polishing accelerating agent; a through-silicon via material polishing speed increasing agent; a silicon contamination preventing agent; and water; and
    wherein
    the silicon polishing accelerating agent is a basic compound having a pKa of 8 or higher,
    the through-silicon via material polishing speed increasing agent is a compound that serves as a ligand for forming a complex with a copper ion, contains at least one oxygen atom serving as a ligand and has a complex stability constant of a complex formed with a copper ion of less than 10,
    the silicon contamination preventing agent contains at least two oxygen atoms serving as ligands for forming a complex with copper and has a complex stability constant of a complex formed with a copper ion of 10 or more.

10. The polishing method according to claim 9, wherein the silicon polishing accelerating agent is one or more selected from tetramethylammonium hydroxide, potassium hydroxide, sodium hydroxide and piperazine.

11. The polishing method according to claim 9, wherein the through-silicon via material polishing speed increasing agent is one or more selected from a monocarboxylic acid and a salt thereof, a polycarboxylic acid and a salt thereof, a hydroxycarboxylic acid and a salt thereof, an amino acid and a salt thereof and a polyoxo compound.

12. The polishing method according to claim 9, wherein the content of the through-silicon via material polishing speed increasing agent is 0.005% by mass or more and 0.5% by mass or less.

13. The polishing method according to claim 9, wherein the silicon contamination preventing agent is selected from an iminocarboxylic acid and an iminophosphonic acid.

14. The polishing method according to claim 9, the silicon polishing accelerating agent is selected from tetramethylammonium hydroxide, ammonium carbonate and ammonium hydrogen carbonate, potassium hydroxide and sodium hydroxide, potassium hydrogen carbonate, potassium carbonate, sodium hydrogen carbonate and sodium carbonate, and heterocyclic amine compounds.

15. The polishing method according to claim 9, the polishing speed increasing agent is selected from arginine, histidine, glycine, alanine and asparagine, formic acid, acetic acid, propionic acid, butyric acid, isobutyric acid, decanoic acid, dodecanoic acid, benzoic acid and phenylacetic acid, oxalic acid, malonic acid, succinic acid, maleic acid and fumaric acid, glycolic acid, gluconic acid, lactic acid, hydroxybutyric acid, hydroxyacetic acid, hydroxybenzoic acid, salicylic acid, tartronic acid, malic acid, tartaric acid and citric acid, phenol, cresol, catechol and resorcinol, glyoxal, malonaldehyde, diacetyl, acetylacetone and pyruvic aldehyde.

16. The polishing method according to claim 9, the silicon contamination preventing agent is selected from iminodiacetic acid, nitrilotriacetic acid, ethylenediaminediacetic acid, ethylenediaminetetraacetic acid, trans-1,2-diaminocyclohexanetetraacetic acid, diethylenetriaminepentaacetic acid, triethylenetetraminehexaacetic acid, 1,6-hexamethylenediaminetetraacetic acid, ethylenediamine diorthohydroxyphenylacetic acid, ethylenediamine-N,N'-bis[(2-hydroxy-5-methylphenyl)acetic acid] and N,N-bis(2-hydroxybenzyl)ethylenediamine-N,N-diacetic acid; phosphonic acids such as nitrilotris(methylenephosphonic acid), 1-hydroxyethylidene-1,1-diphosphonic acid, methanehydroxyphosphonic acid and α-methylphosphonosuccinic acid; and iminophosphonic acids such as ethylenediaminetetrakis(methylenephosphonic acid), ethylenediamine-N,N'-bis[(2-hydroxy-5-methylphenyl)phosphonic acid] and ethylenediamine-N,N'-bis[(2-hydroxy-5-phosphophenyl)phosphonic acid].

\* \* \* \* \*